(12) United States Patent
Kim et al.

(10) Patent No.: US 7,539,034 B2
(45) Date of Patent: May 26, 2009

(54) MEMORY CONFIGURED ON A COMMON SUBSTRATE

(75) Inventors: Jung Pill Kim, Cary, NC (US); Jong-Hoon Oh, Chapel Hill, NC (US); Oliver Kiehl, Charlotte, VT (US); Josef Schnell, Charlotte, VT (US); Klaus Hummler, Apex, NC (US); Wayne Ellis, Jericho, VT (US); Octavian Beldiman, South Burlington, VT (US); Lee Collins, Cary, NC (US)

(73) Assignee: Qimonda North America Corp., Cary, NC (US)

( * ) Notice: Subject to any disclaimer, the term of this patent is extended or adjusted under 35 U.S.C. 154(b) by 24 days.

(21) Appl. No.: 11/701,006

(22) Filed: Feb. 1, 2007

(65) Prior Publication Data

US 2008/0189480 A1 Aug. 7, 2008

(51) Int. Cl.
*G11C 5/00* (2006.01)
*G11C 5/06* (2006.01)
*H01L 23/34* (2006.01)

(52) U.S. Cl. .................... 365/52; 365/63; 257/723; 257/724

(58) Field of Classification Search .................. 365/52
See application file for complete search history.

(56) References Cited

U.S. PATENT DOCUMENTS 5,272,664 A * 12/1993 Alexander et al. ............ 365/52
5,483,421 A * 1/1996 Gedney et al. ............... 361/771
5,990,564 A * 11/1999 Degani et al. ................ 257/778
6,055,655 A * 4/2000 Momohara ................... 714/723
RE36,916 E 10/2000 Moshayedi
6,300,163 B1 * 10/2001 Akram ....................... 438/108
6,437,990 B1 * 8/2002 Degani et al. ................ 361/783
6,507,115 B1 * 1/2003 Hofstee et al. ............... 257/777
6,538,331 B2 * 3/2003 Masuda et al. ............... 257/777
6,737,743 B2 * 5/2004 Urakawa ..................... 257/724
6,815,746 B2 * 11/2004 Suzuki et al. ................ 257/296
6,943,454 B1 9/2005 Gulachenski et al.
7,060,529 B2 * 6/2006 Reithinger et al. ........... 438/110
7,078,788 B2 * 7/2006 Vu et al. ...................... 257/668
7,092,308 B2 * 8/2006 Choi et al. ................... 365/226
7,133,324 B2 * 11/2006 Park et al. ............... 365/185.05
7,164,592 B2 * 1/2007 Yoshikawa et al. ............ 365/51
7,247,932 B1 * 7/2007 Lin et al. ..................... 257/686
7,294,533 B2 * 11/2007 Lebonheur et al. ........... 438/127
2002/0000797 A1 * 1/2002 Schultz et al. ............... 323/282
2002/0118593 A1 * 8/2002 Takemae ..................... 365/233
2004/0012934 A1 1/2004 Jafari et al.
2006/0113647 A1 * 6/2006 Kasberger et al. ........... 257/678
2007/0019494 A1 * 1/2007 Moosrainer et al. ..... 365/230.03
2007/0147157 A1 * 6/2007 Luo et al. .................... 365/226
2007/0153588 A1 * 7/2007 Janzen ..................... 365/189.03
2008/0003717 A1 * 1/2008 Zhou et al. .................. 438/109
2008/0034149 A1 * 2/2008 Sheen ........................ 711/100
2008/0123303 A1 * 5/2008 Sugano et al. ............... 361/728

* cited by examiner

*Primary Examiner*—Son L Mai
(74) *Attorney, Agent, or Firm*—Dicke, Billig & Czaja, PLLC

(57) ABSTRACT

A memory includes a first macro chip, a spine chip, and a common substrate. The common substrate is configured to pass signals between the first macro chip and the spine chip. The first macro chip, the spine chip, and the common substrate provide a memory.

30 Claims, 3 Drawing Sheets

MEMORY CONFIGURED ON A COMMON SUBSTRATE

BACKGROUND

Dynamic random access memories (DRAMs) are available in many different configurations. DRAMs may be configured to have different memory densities, different numbers of memory banks, different input/output (I/O) widths, different numbers of prefetch bits, different functions, and so on. Designing a DRAM having a particular configuration takes a substantial amount of time. Each time a particular function of a DRAM is changed, the semiconductor chip providing the DRAM is redesigned through a partial or full layer change. In some DRAM chips, the top interconnects may be modified to alter the configuration of the DRAM to shorten the design cycle time. In some cases, for DRAM chips having I/O widths of ×4, ×8, and ×16, bonding, fusing, or metal options may be used to alter portions of the configuration of the DRAM chip. Changing the top interconnects, however, still requires considerable design and fabrication time.

Typical DRAM chips with ×32 I/O widths, however, require a chip redesign for each change of the configuration. For example, if the number of prefetch bits is modified or the number of memory banks is modified a full layer change is required. Memory density may be increased in some cases by stacking dies to form multi-chip packages (MCPs). While multi-chip packages can be used to obtain a desired memory density, multi-chip packages cannot be used to configure other functions such as the number of prefetch bits, I/O width, number of memory banks, and so on. These other functions still require a partial or full layer change, which requires considerable design and process time to implement.

For these and other reasons, there is a need for the present invention.

SUMMARY

One embodiment provides a memory. The memory includes a first macro chip, a spine chip, and a common substrate. The common substrate is configured to pass signals between the first macro chip and the spine chip. The first macro chip, the spine chip, and the common substrate provide a memory.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
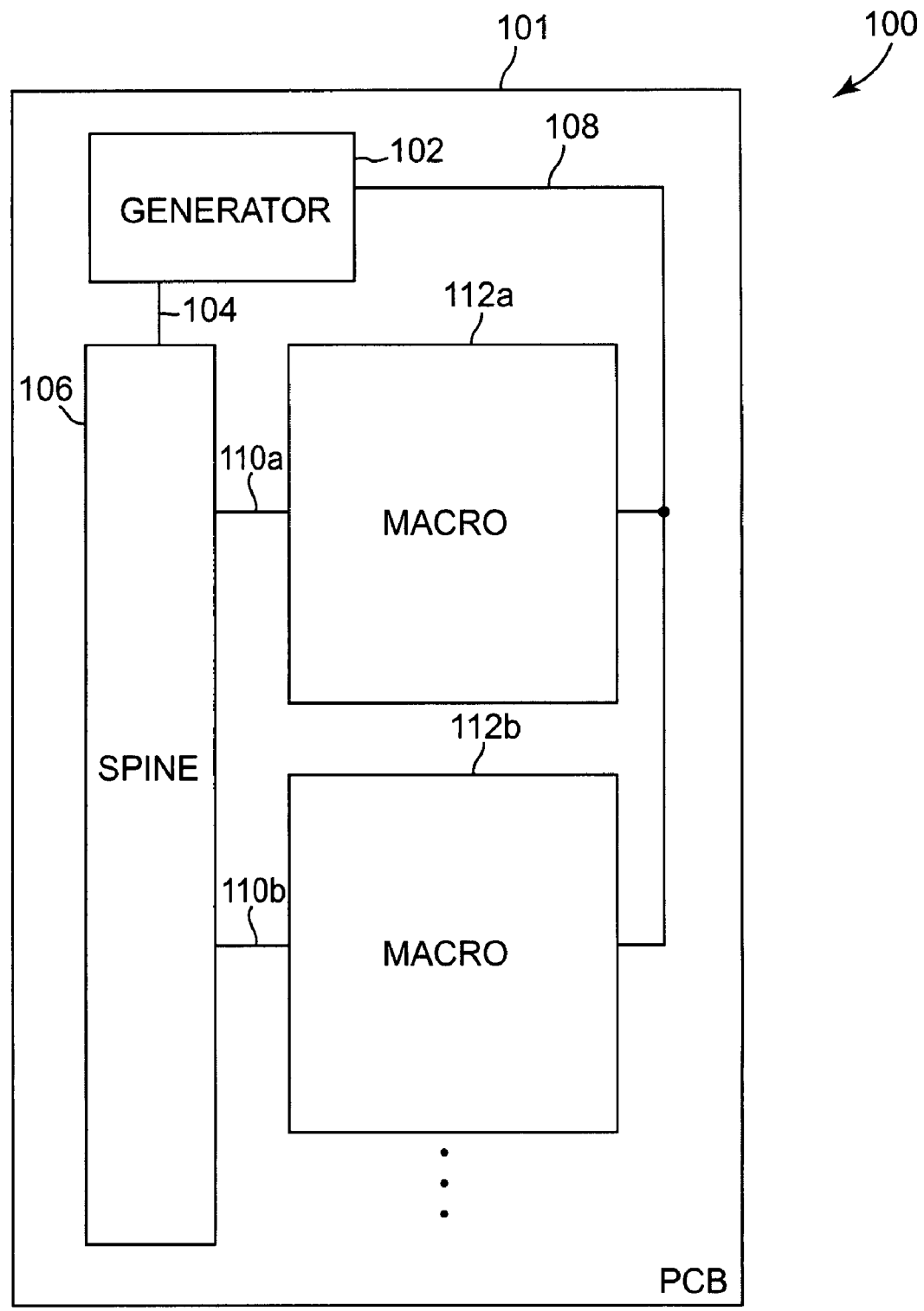
FIG. 1 is a block diagram illustrating one embodiment of a memory device.

FIG. 1 is a block diagram illustrating one embodiment of a memory device 100. Memory device 100 includes a common substrate 101, a generator 102, a spine 106, and macros 112a-112b. In one embodiment, generator 102 is included within spine 106. Generator 102, spine 106, and macros 112a-112b are individual semiconductor chips that are mounted on common substrate 101. Generator 102 is electrically coupled to spine 106 through signal path 104, which is routed through common substrate 101. Generator 102 is electrically coupled to macros 112a-112b through signal path 108, which is also routed through common substrate 101. Spine 106 is electrically coupled to macros 112a-112b through signal paths 110a-110b, which are also routed through common substrate 101.

In one embodiment, common substrate 101 comprises a printed circuit board (PCB). Generator 102 generates reference voltages used to operate memory device 100. Generator 102 provides reference voltages, such as $V_{dd}$, $V_{ss}$, and other reference voltages to spine 106 and macros 112a-112b. Spine 106 includes control logic for controlling the operation of memory device 100. The control logic of spine 106 is configured to provide the desired functionality of memory device 100 including the memory type, the I/O width, the number of prefetch bits, the number of memory banks, and other memory functions. In one embodiment, spine 106 is configured to provide a memory device 100 having an I/O width of ×4, ×8, ×16, ×32, or other suitable I/O width. In one embodiment, spine 106 is configured to provide a memory device having a prefetch of two bits, four bits, eight bits, or other suitable number of bits. In one embodiment, spine 106 is configured to provide a dynamic random access memory (DRAM), such as a single data rate (SDR) DRAM, a double data rate (DDR) DRAM, a DDR-II DRAM, a DDR-III DRAM, or other suitable DRAM. In other embodiments, spine 106 is configured to provide a static random access memory (SRAM), flash memory, or other suitable type of memory. Spine 106 is used to read data from macros 112a-112b and write data to macros 112a-112b through signals path 110a-110b.

In one embodiment, macros 112a-112b include arrays of memory cells. Each array of memory cells includes any suitable number of memory cells to provide a desired storage capacity. In one embodiment, each macro 112a-112b includes a single bank of memory cells, such that two macros are provided to provide two banks of memory cells. In another embodiment, each macro 112a-112b includes more than one bank of memory cells. In other embodiments, any suitable number of macros 112a-112b are coupled to spine 106 and generator 102 to provide the desired storage capacity.

Printed circuit board 101 routes all the signals between the individual semiconductor chips including generator 102, spine 106, and macros 112a-112b. The routing of signals through printed circuit board 101 is used in place of metallization layers of a typical memory, which includes a generator, a spine, and macros within a single semiconductor chip. The generator 102, spine 106, and macro 112a-112b chips can be designed and selected individually and combined on printed circuit board 101 to provide a DRAM having the desired functionality and configuration. In this way, front end and back end processes can be done in parallel such that generator 102, spine 106, macros 112a-112b, and/or other suitable DRAM building block chips and printed circuit board 101 can be designed in parallel.

The common substrate and building block design and fabrication process of memory device 100 makes the design cycle time very short compared to typical DRAM design cycle times. If each DRAM building block of memory device 100 is prepared and fabricated for final configuration, the time to design a new DRAM is as short as the time to design printed circuit board 101 to route the signals between the selected DRAM building blocks. Since DRAMs with many different configurations can be made using the common substrate and building block design and fabrication process, a large memory portfolio can be obtained using much less design time as compared to typical design methods. DRAM configurations including I/O widths such as ×4, ×8, ×16, and ×32 can be provided using the common substrate and building block design and fabrication process. In the case where certain DRAM building blocks such as the spine or the macros need to be redesigned for different functions, design time is still shorter compared to typical design methods since the other DRAM building blocks such as generator 102 are already designed and ready for final configuration.

Figure 2:
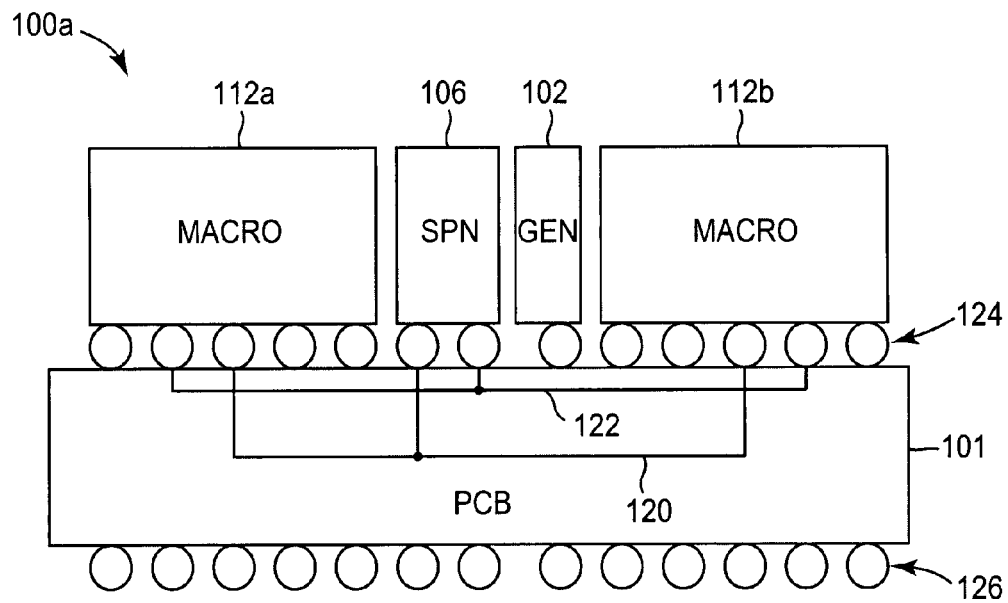
FIG. 2 is a diagram illustrating another embodiment of a memory device.

FIG. 2 is a diagram illustrating one embodiment of a memory device 100a. Memory device 100a includes a generator chip 102, a spine chip 106, macro chips 112a-112b, and a printed circuit board 101. Generator chip 102, spine chip 106, and macro chips 112a-112b are electrically coupled to one side of printed circuit board 101 through a first ball grid array interface 124. Spine 106 is electrically coupled to generator chip 102 and macro chips 112a-112b through signal paths within printed circuit board 101, such as for example signal paths 120 and 122. In other embodiments, any suitable number of macro chips 112a-112b can be used. In one embodiment, one or more of the DRAM building blocks can be mounted on the other side of printed circuit board 101 through a second ball grid array interface 126.

In one embodiment, macro chips 112a-112b, spine chip 106, and generator chip 102 are previously designed and tested DRAM building blocks for providing the final configuration of memory device 100a. The final configuration of memory device 100a is completed through printed circuit board 101. Printed circuit board 101 includes a plurality of layers for routing signals and power lines between the DRAM building blocks. Configuration for spine chip 106 is also possible through a printed circuit board change. In this embodiment, two macro chips 112a-112b, spine chip 106, and generator chip 102 are used and configured using multiple printed circuit board layers such that internal signals are communicated between each DRAM building block.

Figure 3:
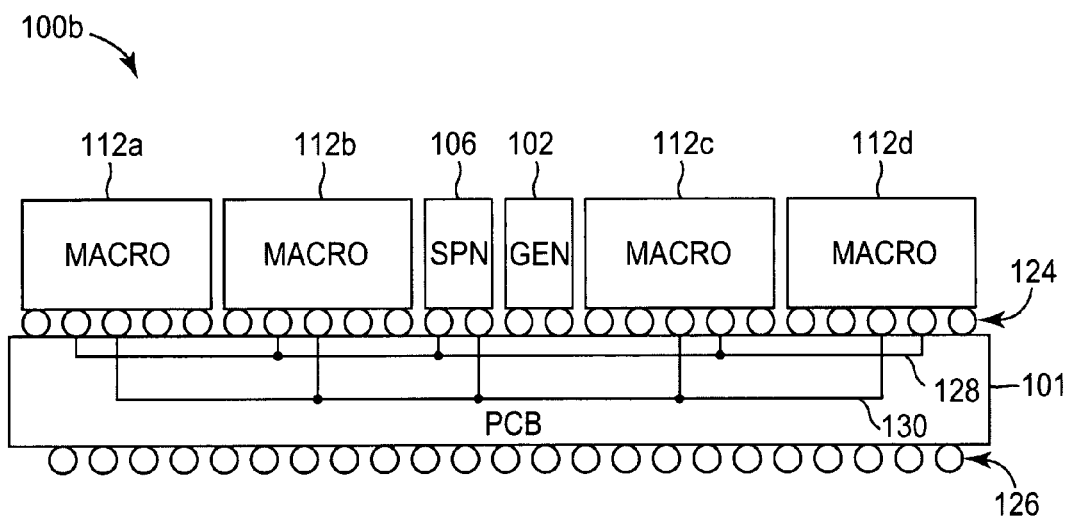
FIG. 3 is a diagram illustrating another embodiment of a memory device.

FIG. 3 is a diagram illustrating another embodiment of a memory device 100b. Memory device 100b includes a generator chip 102, a spine chip 106, macro chips 112a-112d, and a printed circuit board 101. In this embodiment, four macro chips 112a-112d, one spine chip 106, and a different sized generator chip 102 are used to provide another DRAM configuration. Generator chip 102, spine chip 106, and macro chips 112a-112d are electrically coupled to one side of printed circuit board 101 through a first ball grid array interface 124. Spine chip 106 is electrically coupled to generator chip 102 and macro chips 112a-112d through signal paths within printed circuit board 101, such as for example signal paths 128 and 130. In other embodiments, any suitable number of macro chips 112a-112d can be used. In one embodiment, one or more of the DRAM building blocks can be mounted on the other side of printed circuit board 101 through a second ball grid array interface 126.

In one embodiment, macro chips 112a-112d, spine chip 106, and generator chip 102 are previously designed and tested DRAM building blocks for fabricating the final configuration of memory device 100b. The final configuration of memory device 100b is completed through printed circuit board 101. Printed circuit board 101 includes a plurality of layers for routing signals and power lines between the DRAM building blocks. By simply combining pre-designed DRAM building blocks on printed circuit board 101, a more diverse range of DRAM products can be designed in a short time period compared to typical DRAM design methods.

Figure 4:
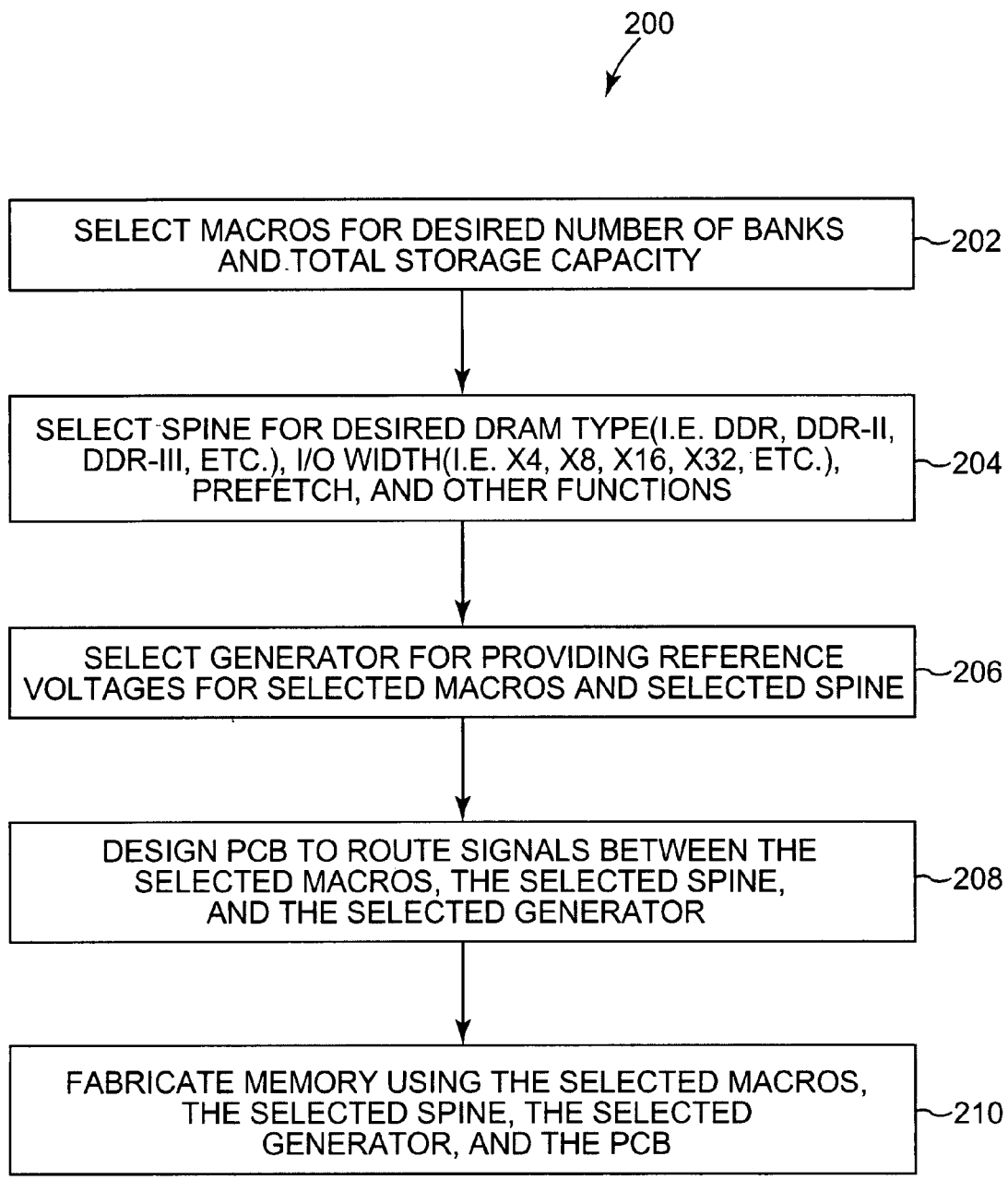
FIG. 4 is a flow diagram illustrating one embodiment of a method for designing a dynamic random access memory (DRAM).

FIG. 4 is a flow diagram illustrating one embodiment of a method 200 for designing and fabricating a DRAM. At 202, the DRAM designer selects the macros for the desired number of memory banks and the total storage capacity of the DRAM. At 204, the DRAM designer selects the spine for the desired DRAM type (i.e., SDR, DDR, DDR-II, DDR-III, etc.), the I/O width (i.e., ×4, ×8, ×16, ×32, etc.), the number of prefetch bits (i.e., two bits, four bits, eight bits, etc.), and other functions desired for the DRAM. At 206, the DRAM designer selects the generator for providing the reference voltages for the selected macros and the selected spine. The selected macros, spine, and generator are pre-designed or newly designed specifically for the DRAM.

At 208, the DRAM designer designs the printed circuit board to route the signals between the selected macros, spine, and generator. At 210, the new DRAM memory design is fabricated using the selected macro building blocks, the selected spine building block, the selected generator building block, and the newly designed printed circuit board. The entire design process as indicated at 200 for the building block and common substrate design and fabrication process is substantially shorter than typical design methods for single semiconductor chip DRAMs.

Embodiments of the present invention provide a method for designing and configuring a DRAM in a short time period. By routing signals through a printed circuit board to combine pre-designed and ready-to-use DRAM building blocks, such as pre-built generator chips, spine chips, and macro chips, a DRAM having the desired functionality can be designed and fabricated quickly.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a first macro chip;
   a spine chip; and
   a substrate configured to pass signals between the first macro chip and the spine chip, wherein the first macro chip, the spine chip, and the substrate provide a memory, and
wherein the spine chip provides one of a $2^N$ bit prefetch, where N is an integer.

2. The memory of claim 1, further comprising:
a generator chip,
wherein the substrate is configured to pass signals between the first macro chip, the spine chip, and the generator chip.

3. The memory of claim 2, wherein the memory comprises a dynamic random access memory.

4. The memory of claim 1, wherein the substrate comprises a printed circuit board.

5. The memory of claim 3, wherein the spine chip provides one of a ×4, ×8, ×16, and ×32 input/output width.

6. The memory of claim 3, wherein the spine chip provides one of a two bit prefetch, a four bit prefetch, and an eight bit prefetch.

7. The memory of claim 1, wherein the first macro chip comprises an array of memory cells.

8. The memory of claim 7, further comprising:
a second macro chip for doubling a storage capacity of the memory.

9. A memory comprising:
a memory array chip;
a control logic chip;
a reference voltage generator chip; and
a printed circuit board configured to pass signals between the first memory array chip, the control logic chip, and the reference voltage generator chip,
wherein the memory array chip, the control logic chip, the reference voltage generator chip, and the printed circuit board provide a dynamic random access memory, and
wherein the control logic chip provides one of a two bit prefetch, a four bit prefetch, and an eight bit prefetch.

10. The memory of claim 9, wherein the memory array chip, the control logic chip, the reference voltage generator chip, and the printed circuit board provide a double data rate dynamic random access memory.

11. The memory of claim 9, wherein the memory array chip, the control logic chip, the reference voltage generator chip, and the printed circuit board provide a double data rate II dynamic random access memory.

12. The memory of claim 9, wherein the memory array chip, the control logic chip, the reference voltage generator chip, and the printed circuit board provide a double data rate III dynamic random access memory.

13. The memory of claim 9, wherein the memory array chip is coupled to the printed circuit board through a ball grid array.

14. The memory of claim 9, wherein the printed circuit board is configured to pass power signals to the first memory array chip, the control logic chip, and the reference voltage generator chip.

15. A memory comprising:
means for storing data;
means for generating reference voltages;
means for reading data from and writing data to the means for storing data; and
a common substrate interconnecting the means for storing data, the means for generating reference voltages, and the means for reading data and writing data to provide a memory,
wherein the means for reading data from and writing data to the means for storing data provides one of a $2^N$ bit prefetch, where N is an integer.

16. The memory of claim 15, wherein the common substrate comprises a printed circuit board.

17. The memory of claim 15, wherein the memory comprises a dynamic random access memory.

18. A method for fabricating a memory, the method comprising:
providing a first macro chip;
providing a spine chip; and
coupling the first macro chip and the spine chip to a common substrate configured to pass signals between the first macro chip and the spine chip to provide a memory,
wherein providing the spine chip comprises providing a spine chip that provides one of a $2^N$ bit prefetch, where N is an integer.

19. The method of claim 18, further comprising:
providing a generator chip; and
coupling the generator chip to the common substrate configured to pass signals between the first macro chip, the spine chip, and the generator chip.

20. The method of claim 19, wherein coupling the first macro chip, the spine chip, and the generator chip to the common substrate comprises coupling the first macro chip, the spine chip, and the generator chip to the common substrate to provide a dynamic random access memory.

21. The method of claim 19, wherein coupling the first macro chip, the spine chip, and the generator chip to the common substrate comprises coupling the first macro chip, the spine chip, and the generator chip to a printed circuit board.

22. The method of claim 20, wherein providing the spine chip comprises providing a spine chip that provides one of a ×4, ×8, ×16, and ×32 input/output width.

23. The method of claim 20, wherein providing the spine chip comprises providing a spine chip that provides one of a two bit prefetch, a four bit prefetch, and an eight bit prefetch.

24. The method of claim 18, wherein providing the first macro chip comprises providing an array of memory cells.

25. The method of claim 24, further comprising:
coupling a second macro chip to the common substrate for doubling a storage capacity of the memory.

26. A method for fabricating a memory, the method comprising:
providing a memory array chip;
providing a control logic chip;
providing a reference voltage generator chip; and
coupling the memory array chip, the control logic chip, and the reference voltage generator chip to a printed circuit board configured to pass signals between the memory array chip, the control logic chip, and the reference voltage generator chip to provide a dynamic random access memory,
wherein providing the control logic chip comprises providing a control logic chip that provides one of a two bit prefetch, a four bit prefetch, and an eight bit prefetch.

27. The method of claim 26, wherein coupling the memory array chip, the control logic chip, and the reference voltage generator chip to the printed circuit board comprises coupling the memory array chip, the control logic chip, and the reference voltage generator chip to provide a double data rate dynamic random access memory.

28. The method of claim 26, wherein coupling the memory array chip, the control logic chip, and the reference voltage generator chip to the printed circuit board comprises coupling the memory array chip, the control logic chip, and the reference voltage generator chip to provide a double data rate II dynamic random access memory.

29. The method of claim 26, wherein coupling the memory array chip, the control logic chip, and the reference voltage generator chip to the printed circuit board comprises coupling the memory array chip, the control logic chip, and the reference voltage generator chip to provide a double data rate III dynamic random access memory.

30. The method of claim 26, wherein coupling the memory array chip to the printed circuit board comprises coupling the memory array chip to the printed circuit board through a ball grid array.

* * * * *